United States Patent
Ra (10) Patent No.: US 6,225,830 B1
(45) Date of Patent: May 1, 2001

(54) DIFFERENTIAL MODE LOGIC GATE HAVING NAND AND NOR PORTIONS TO PRODUCE COMPLEMENTARY OUTPUTS

(75) Inventor: Youn-Wook Ra, Seoul (KR)

(73) Assignee: Hyundai Electronics Industries, Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/290,543

(22) Filed: Apr. 12, 1999

(30) Foreign Application Priority Data

Apr. 14, 1998 (KR) .................................................. 98-13204

(51) Int. Cl.[7] .............................................. H03K 19/094
(52) U.S. Cl. ........................................... 326/121; 326/112
(58) Field of Search ................................... 326/119, 121, 326/112, 115; 327/51, 52

(56) References Cited

U.S. PATENT DOCUMENTS

| | | | |
|---|---|---|---|
| 5,149,992 | * 9/1992 | Allstot et al. | 326/121 |
| 5,179,358 | * 1/1993 | Martin | 326/119 |
| 5,218,246 | * 6/1993 | Lee et al. | 326/121 |
| 5,254,891 | * 10/1993 | Dorler et al. | 326/119 |
| 5,568,073 | * 10/1996 | McClure | 327/51 |
| 5,583,456 | * 12/1996 | Kimura | 326/121 |
| 5,592,107 | * 1/1997 | McDermott et al. | 326/121 |
| 5,610,539 | 3/1997 | Blauschild et al. . | |
| 5,920,205 | * 7/1999 | Bushehki et al. | 326/112 |

OTHER PUBLICATIONS

IEEE International Solid–State Circuits Conference 1996 (2 pages).

* cited by examiner

Primary Examiner—Michael Tokar
Assistant Examiner—Don Phu Le

(57) ABSTRACT

The differential mode gate includes a first load resistance having a first current driving capability. The first load resistance is connected to a power supply voltage. A constant current source, having a second current driving capacity, is connected to ground. A first logic gate is connected between the first load resistance and the constant current source. The first logic gate performs a first logic operation on received inputs to generate a first output. The differential mode gate additionally includes a second load resistance and a second logic gate. The second load resistance has a third current driving capability and is connected to the power supply voltage. The second logic gate is connected between the second load resistance an the constant current source, and performs a second logic operation on the received inputs to generate a second output.

12 Claims, 11 Drawing Sheets

| A1 | B1 | Z1 |
|----|----|----|
| 0  | 0  | 1  |
| 0  | 1  | 1  |
| 1  | 0  | 1  |
| 1  | 1  | 0  |

| A2 | B2 | Z2 |
|----|----|----|
| 0  | 0  | 1  |
| 0  | 1  | 0  |
| 1  | 0  | 0  |
| 1  | 1  | 0  |

| A3 | B3 | Z3 | /Z3 |
|----|----|----|-----|
| 0  | 0  | 1  | 0   |
| 0  | 1  | 1  | 0   |
| 1  | 0  | 1  | 0   |
| 1  | 1  | 0  | 1   |

| A3 | B3 | Z4 | /Z4 |
|----|----|----|-----|
| 0  | 0  | 1  | 0   |
| 0  | 1  | 0  | 1   |
| 1  | 0  | 0  | 1   |
| 1  | 1  | 0  | 1   |

FIG. 6

DIFFERENTIAL MODE LOGIC GATE HAVING NAND AND NOR PORTIONS TO PRODUCE COMPLEMENTARY OUTPUTS

BACKGROUND OF THE INVENTION

1. Field of the Invention

The present invention relates to logic circuits, and more particularly to logic gates with improved operating speed and noise properties.

2. Discussion of Related Art

NAND and NOR gates are the basic logic elements used for representing a digital logic circuit in a semiconductor integrated circuit. In general, the logic elements used in a digital logic circuit include AND, OR, NOT, NAND, NOR, XOR and XNOR gates. All these logic elements do not have a different circuit from each other. Instead, a combination of NAND, NOR and NOT gates defines circuits of the other logic elements. For instance, the circuit of an AND gate is defined by connecting, in series, a NOT gate to the output of a NAND gate. The circuit of an OR gate is defined by connecting, in series, a NOT gate to the output of a NOR gate.

Figure 1A:
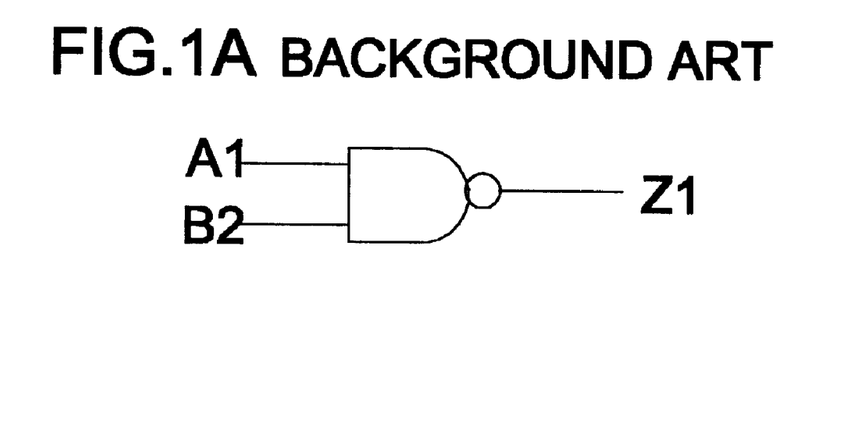
FIGS. 1A to 1C show a related art NAND gate.
Figure 1B:
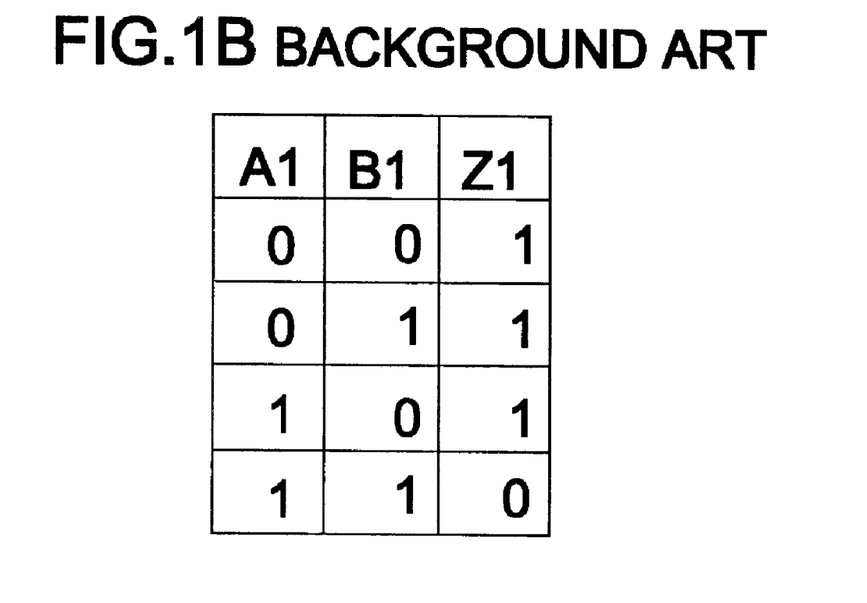
Figure 1C:
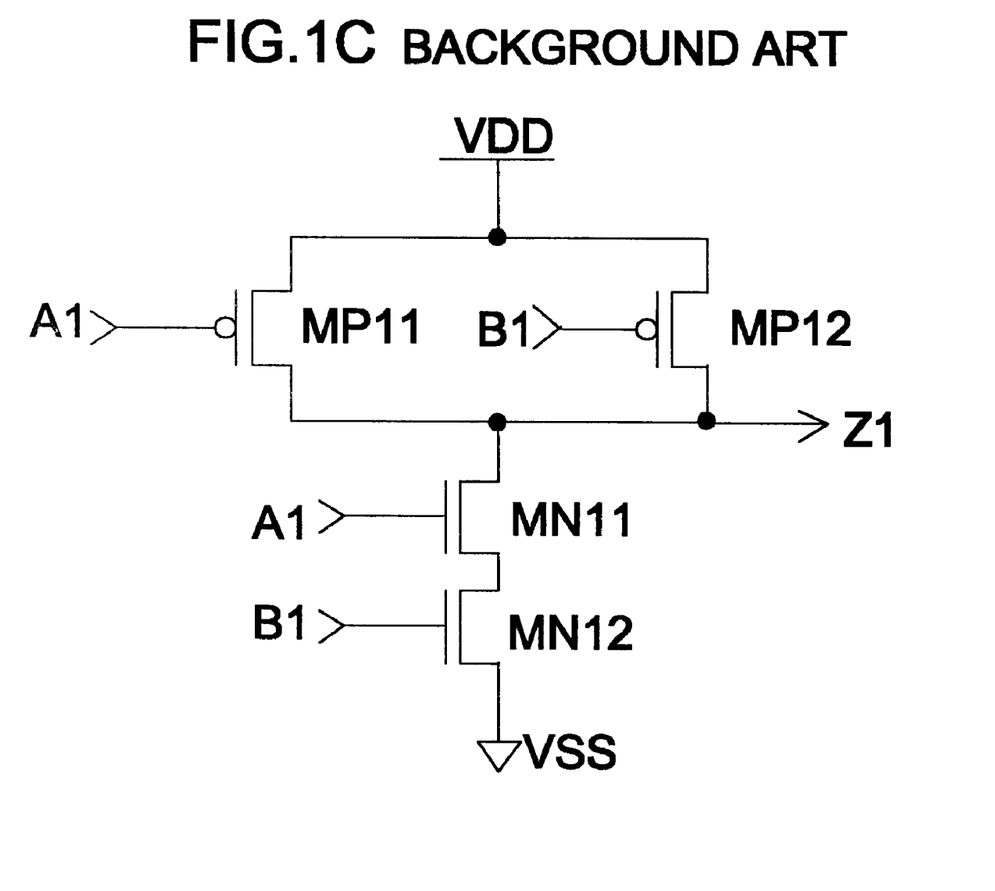

FIGS. 1A, 1B and 1C are the logical symbol, truth table, and circuit, respectively, of a related art NAND gate. In FIG. 1A, A1 and B1 are input signals, and Z1 is an output signal. A logical value of output signal Z1 is determined by the logical values of the, two input signals A1 and B1. FIG. 1B is the truth table of output signal Z1 based on input signals A1 and B1. When at least one of A1 and B1 is 0 (VSS), output signal Z1 becomes 1 (VDD). On the other hand, when both input signals A1 and B1 are 1, output signal Z1 becomes 0.

In FIG. 1C, two PMOS transistors MP11 and MP12, of which sources are supplied a power supply voltage VDD, are connected in parallel to form a pull-up circuit. The gate of PMOS transistor MP11 is supplied the first input signal A1 and the gate of the other PMOS transistor MP12 is supplied the second input signal B1. The drains of the two transistors MP11 and MP12 are connected to each other to form a common node.

Two NMOS transistors MN11 and MN12 are connected in series between the common node and ground VSS to form a pull-down circuit. The gate of NMOS transistor MN11, which is directly connected to the common node, is supplied input signal A1 and the gate of NMOS transistor MN12, which is connected to the ground VSS, is supplied input signal B1.

When at least one of the two input signals A1 and B1 is 0 (VSS), at least one of the two PMOS transistors MP11 and MP12 is turned on, and at least one of the two NMOS transistors MN11 and MN12 is turned off. Therefore, output signal Z1 becomes 1 (VDD). On the other hand, when both input signals A1 and B1 are 1, the two PMOS transistors MP11 and MP12 are turned off, and the two NMOS transistors MN11 and MN12 are turned on. Therefore, output signal Z1 becomes 0.

Figure 2A:
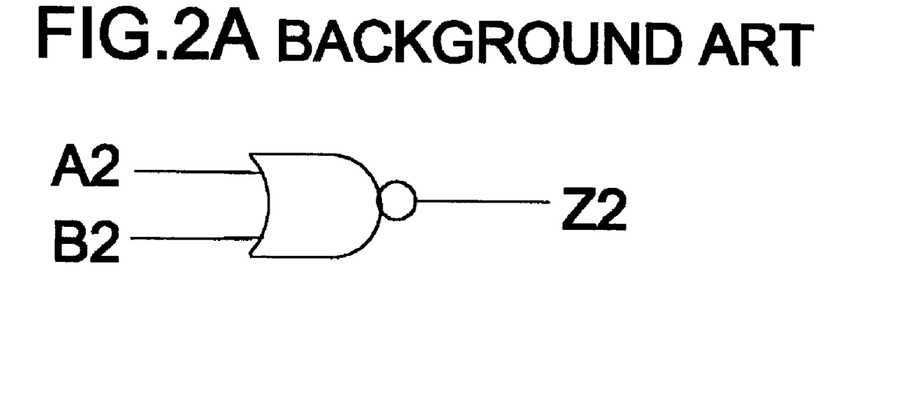
FIGS. 2A to 2C show a related art NOR gate.
Figure 2B:
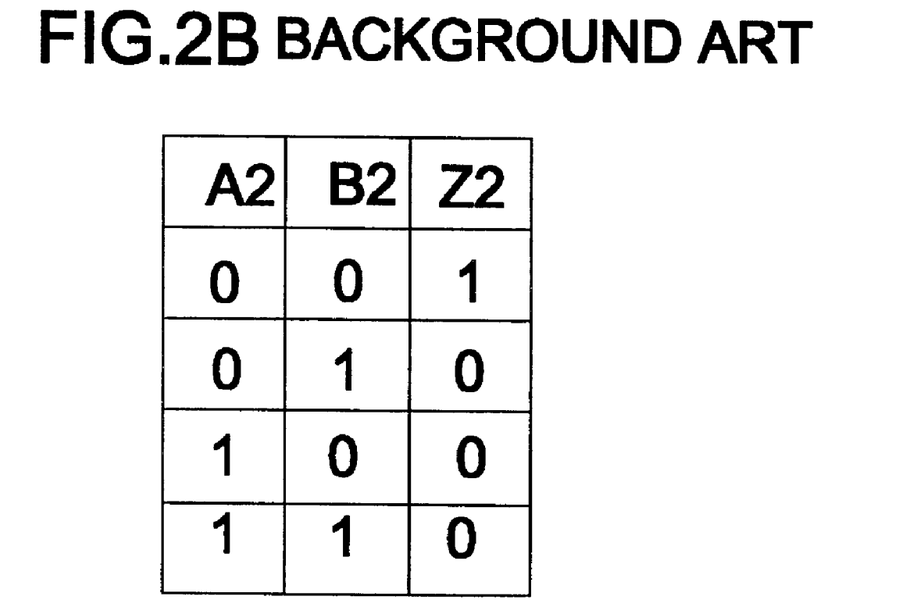
Figure 2C:
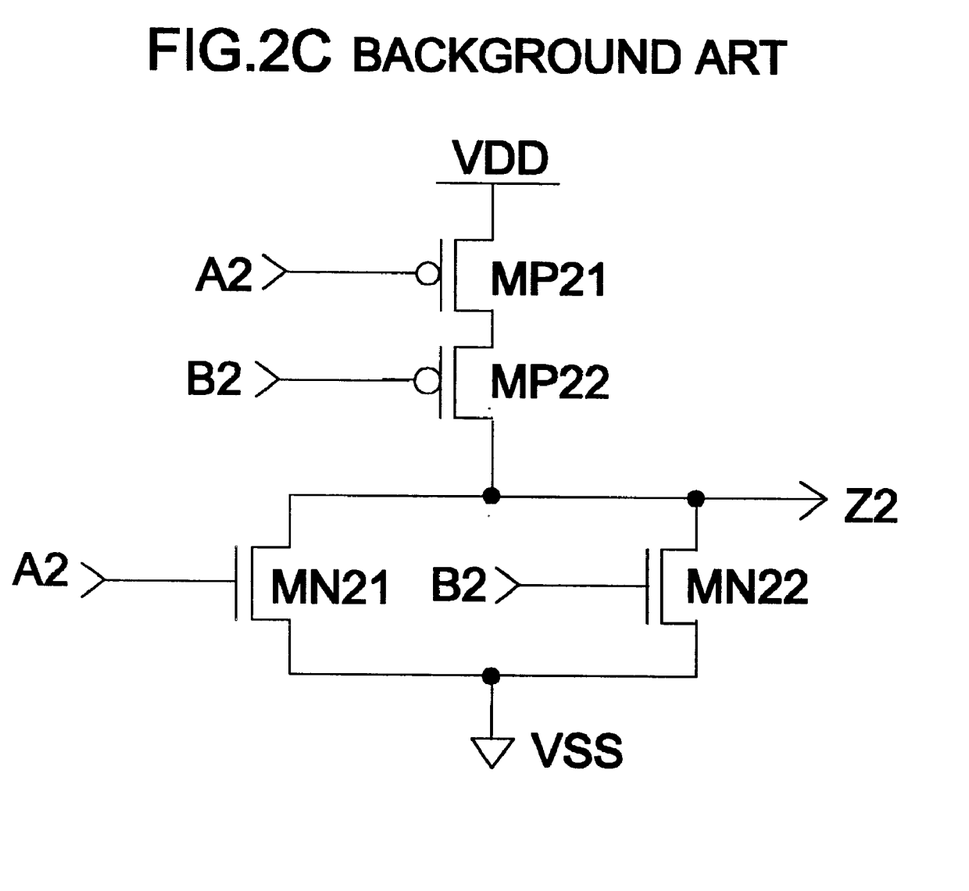

FIGS. 2A, 2B and 2C are the logical symbol, truth table, and circuit, respectively, of a related art NOR gate. In FIG. 2A, A2 and B2 are input signals and Z2 is an output signal. A logical value of output signal Z2 is determined by the logical values of the two input signals A2 and B2. FIG. 2B is a truth table of output signal Z2 based on input signals A2 and B2. As shown in the truth table, when at least one of the two input signals A2 and B2 is 1, output signal Z2 becomes 0. On the other hand, if both of the two input signals A2 and B2 are 0, output signal Z2 is 1.

In FIG. 2C, two PMOS transistors MP21 and MP22, of which sources are supplied the power supply voltage VDD, are connected in parallel to form a pull-up circuit. The gate of PMOS transistor MP21 is supplied the input signal A2 and the gate of PMOS transistor MP22 is supplied the input signal B2. Two NMOS transistors MN21 and MN22 are connected in parallel between the drain of PMOS transistor MP22 and the ground VSS to form a pull-down circuit. The gate of NMOS transistor MN21 is supplied input signal A2 and the gate of NMOS transistor MN22 is supplied input signal B2.

When at least one of the two input signals A2 and B2 is 1, at least one of the two PMOS transistors MP21 and MP22 is turned off, and at least one of the two NMOS transistors MN21 and MN22 is turned on. Therefore, output signal Z2 becomes 0. On the other hand, when both input signals A2 and B2 are 0, the two PMOS transistors MP21 and MP22 are turned on and the two NMOS transistors MN21 and MN22 are turned off. Therefore, output signal Z2 becomes 1.

As described above, in a NAND gate or a NOR gate of the related art, the output signal fully swings between the levels of the power supply voltage VDD and the ground voltage VSS. Therefore, high-speed operation and low power consumption can not be expected. Also, since the highest levels of the input/output signals are in a single mode, a power supply voltage and ground voltage, if the power supply voltage is varied because of temperature variations, the output signal fails to have a stable logic value. As a result, the reliability of circuit operation is remarkably reduced.

SUMMARY OF THE INVENTION

Accordingly, the present invention is directed to a logic circuit that substantially obviates one or more of the problems due to limitations and disadvantages of the related art.

An object of the present invention is to provide a logic circuit having high operation speed and low power consumption.

Another object of the present invention is to reduce chip size by simultaneously representing, for example, a NAND gate and a NOR gate in a logic circuit, and decreasing the number of gates.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

These and other objects are achieved by providing a logic circuit including a first load resistance, a constant current source, and a first logic gate connected between the first load resistance and the constant current source. The first load resistance has a first current driving capability and is connected to a power supply voltage. The constant current source has a second current driving capacity and is connected to ground. The first logic gate performs a first logic operation on received inputs to generate a first output.

These and other objects are also achieved by further providing a second load resistance and a second logic gate. The second load resistance has a third current driving capability and is connected to the power supply voltage. The second logic gate is connected between the second load resistance and the constant current source, and performs a second logic operation on received inputs to generate a second output.

BRIEF DESCRIPTION OF THE ATTACHED DRAWINGS

The accompanying drawings, which are included to provide a further understanding of the invention and which are incorporated in and constitute a part of this specification, illustrate embodiments of the invention, wherein like reference numerals denote like components, and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 3A:
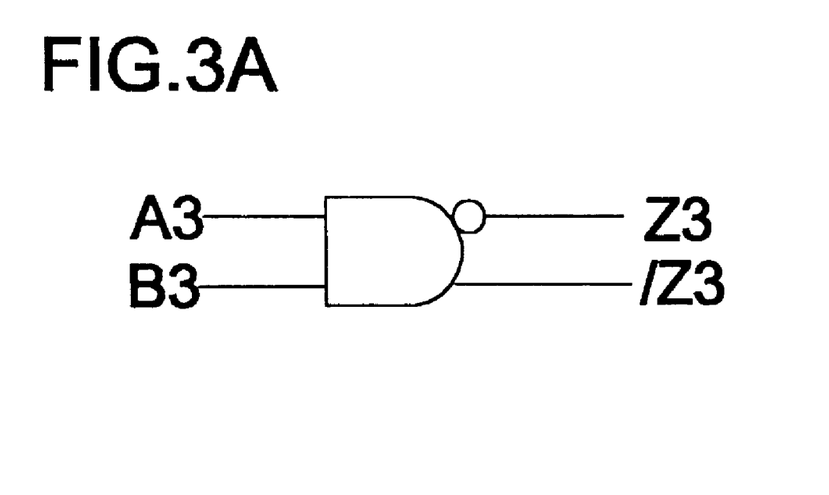
FIGS. 3A to 3C show differential mode NAND/NOR gates according to an embodiment of the present invention.
Figure 3B:
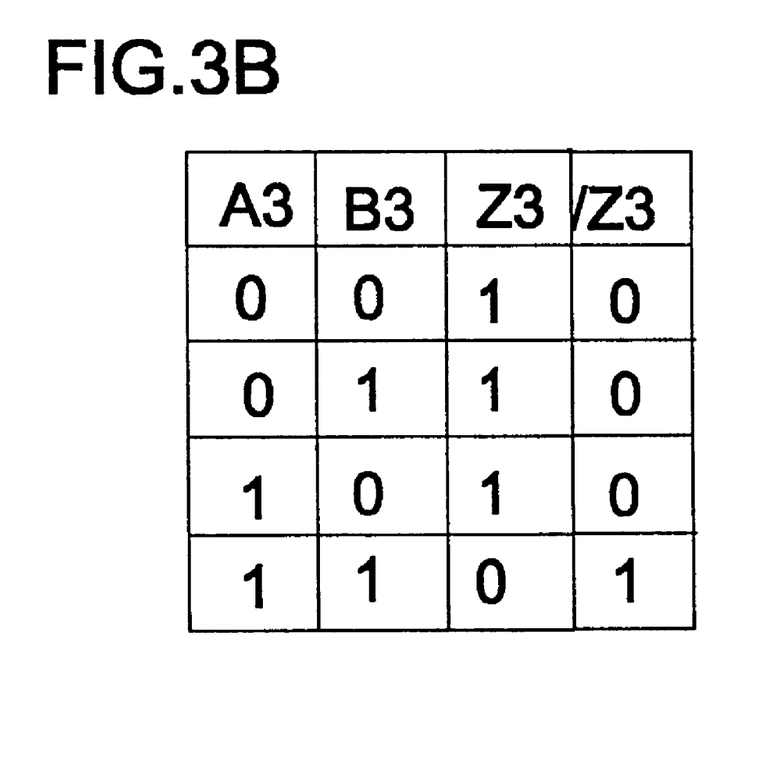
Figure 3C:
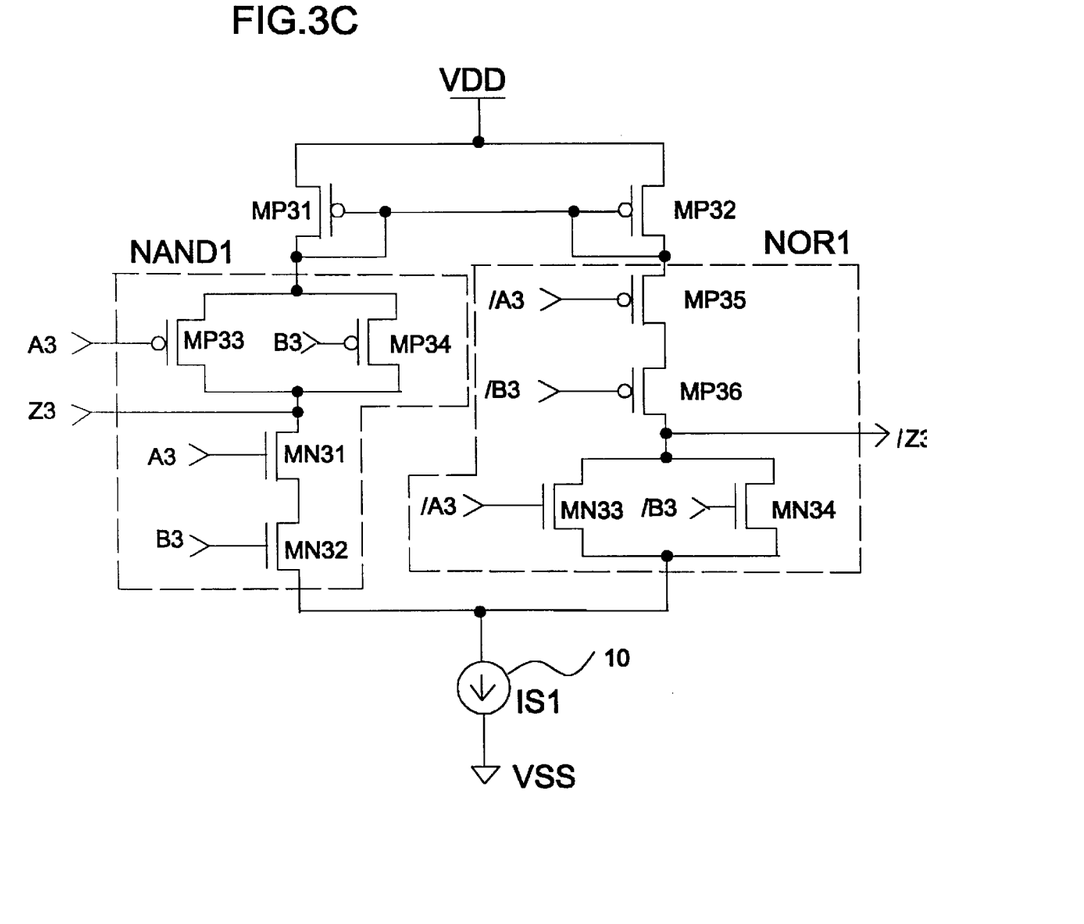

FIG. 3A to 3C are the logic symbol, truth table and circuit of differential mode NAND/NOR gates according to the present invention, respectively.

In FIG. 3A, A3 and B3 are input signals. Z3 and /Z3 are output signals, which are complementary. Output signal Z3 is obtained by a NAND operation on the two input signals A3 and B3. That is, as shown in FIG. 3B, when at least one of the two input signals A3 and B3 is 0, the output signal Z3 becomes 1, while when both input signals A3 and B3 are 1, output signal Z3 becomes 0.

In FIG. 3C, respective gates and drains of two PMOS transistors MP31 and MP32, acting as active loads, are connected each other. The respective sources of the two PMOS transistors MP31 and MP32 are supplied with the power supply voltage VDD. The gates of the two PMOS transistors MP31 and MP32 are connected to each other. This equalizes the voltages applied to the gates of the two PMOS transistors MP31 and MP32, and overcomes a mismatch of the two PMOS transistors MP31 and MP32 caused during the manufacturing process.

The drain of PMOS transistor MP31 is connected to a NAND gate circuit NAND1. In NAND gate circuit NAND1, two PMOS transistors MP33 and MP34 are connected in parallel to form a pull-up circuit. The gate of PMOS transistor MP33 is supplied input signal A3 and the gate of PMOS transistor MP34 is supplied input signal B3. The drains of the two transistors MP33 and MP34 are connected to form a common node. Two NMOS transistors MN31 and MN32 are connected in series between this common node and a constant current source 10 to form a pull-down circuit. The gate of NMOS transistor MN31 is supplied input signal A3 and the gate of NMOS transistor MN32 is supplied input signal B3. The constant current source 10 is connected between the source of NMOS transistor MN32 and the ground.

When at least one of the two input signals A3 and B3 is 0, at least one of the two PMOS transistors MP33 and MP34 is turned on and at least one of two NMOS transistors MN31 and MN32 is turned off. Therefore output signal Z3 becomes 1.

When both of the two input signals A3 and B3 are 1, both of the two PMOS transistors MP33 and MP34 are turned off and both of the two NMOS transistors MN31 and MN32 are turned on. Therefore output signal Z3 becomes 0.

The drain of PMOS transistor MP32 is connected to a NOR gate circuit NOR1. In NOR gate circuit NOR1, two PMOS transistors MP35 and MP36, which are supplied the power supply voltage VDD, are connected in series to form a pull-up circuit. The gate of PMOS transistor MP35 is supplied the inverted input signal /A3, and the gate of PMOS transistor MP36 is supplied the inverted input signal /B3. Two NMOS transistors MN33 and MN34 are connected in parallel between the drain of PMOS transistor MP36 and the constant current source 10 to form a pull-down circuit. The gate of NMOS transistor MN33 is supplied the inverted input signal /A3, and the gate of NMOS transistor MN34 is supplied the inverted input signal /B3. The sources of the two NMOS transistors MN33 and MN34 are connected to each other to form a common node. This common node and the source of NMOS transistor MN32 are connected to the constant current source 10.

When at least one of the two input signals A3 and B3 is 0, at least one of the two inverted input signals /A3 and /B3 is 1 and at least one of the two PMOS transistors MP35 and MP36 is turned off. Also, at least one of the two NMOS transistors MN33 and MN34 is turned on. Therefore output signal /Z3 becomes 0. When both of the input signals A3 and B3 are 1, both of the inverted input signals /A3 and /B3 are 0 and both of the PMOS transistors MP35 and MP36 are turned on. Also, the two NMOS transistors MN33 and MN34 are turned off. Therefore output signal /Z3 becomes 1.

In the above description, the voltage level of two logic values 1 and 0 is determined by the current driving capabilities of PMOS transistors MP31 and MP32 and constant current source 10. When one or both of the two PMOS transistors MP33 and MP34 are turned on, the highest voltage level of output signal Z3 is determined by the current driving capability of PMOS transistor MP31. Therefore, it is possible to establish a desired highest voltage level of output signal Z3 by appropriately designing the current driving capability of PMOS transistor MP31.

When both NMOS transistors MN31 and MN32 are turned on, the lowest voltage level of output signal Z3 is determined by the current driving capability of constant current source 10. Therefore, it is possible to establish a desired lowest voltage level by appropriately designing the current driving capability of constant current source 10.

In the differential mode NAND/NOR gates according to the present invention, operation speed is improved and power consumption is reduced by, preferably, reducing the swing width of output signals Z3 and /Z3. This is accomplished by appropriately designing the current driving capabilities of PMOS transistors MP31 and MP32 and constant current source 10.

If the current driving capability of each PMOS transistor MP31 and MP32 and constant current source 10 is small, the current driving capability of each MOS transistor, of which NAND and NOR gate circuits NAND1 and NOR1 consist, does not have to be increased. Therefore, the current driving capability can be designed in such a way that the respective current driving capabilities of PMOS transistors MP31 and MP32, NAND gate circuit NAND1 and NOR gate circuit NOR1 are all the same, under the circumstance that the difference of mobility of each carrier of PMOS and NMOS transistors is sufficiently considered.

The fact that the current driving capabilities of MOS transistors in the NAND and NOR gate circuits NAND1 and NOR1 are the same as that of PMOS transistors MP31 and MP32 and constant current source 10 means that the voltage range of input signals A3, B3, /A3 and /B3 may be the same as that of output signals Z3 and /Z3. Therefore, when a circuit is designed using a plurality of differential mode NAND/NOR gates according to the present invention, matching the characteristics of input and output signals becomes a lesser concern.

Figure 4A:
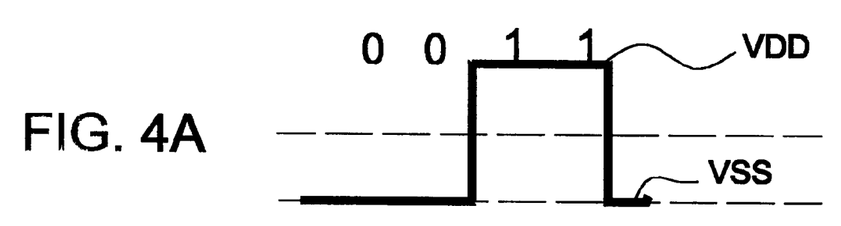
FIGS. 4A to 4F compare input/output signals of the differential mode NAND/NOR gate of FIG. 3C with input/output signals of the NAND gate of FIG. 1C.
Figure 4B:
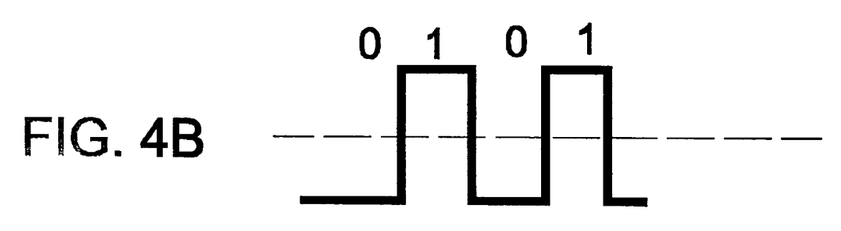
Figure 4C:
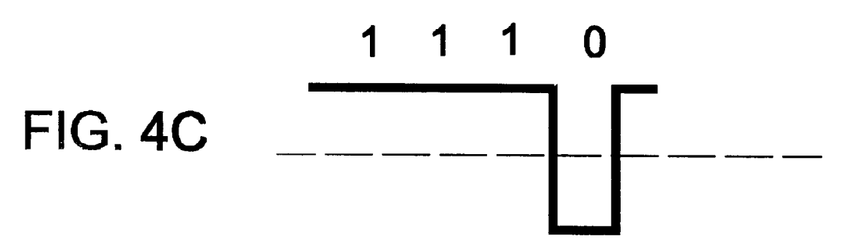
Figure 4D:
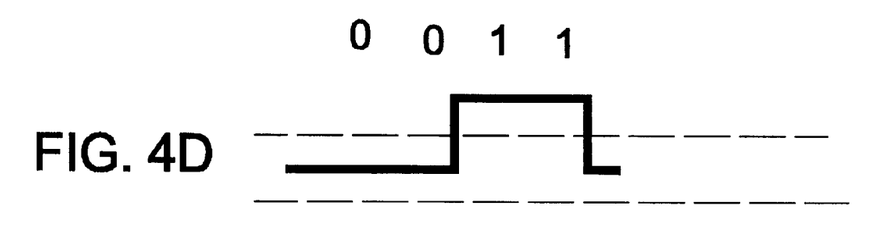
Figure 4E:
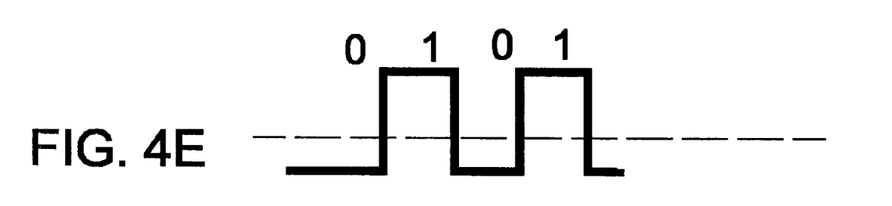
Figure 4F:
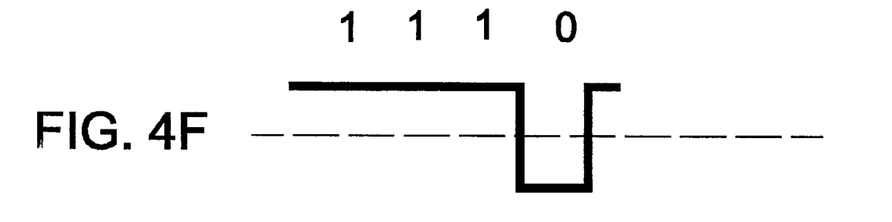

FIGS. 4A–4F compare input/output signals of differential mode NAND/NOR gates of FIG. 3C with input/output signals of the NAND gate of FIG. 1C. FIGS. 4A and 4B are inputs of two-bit logic signals of the related art. FIG. 4C is a result of the NAND operation of FIG. 1C. As shown in FIGS. 4A to 4C, in a related art NAND gate, both input and output signals fully swing between the power supply source VDD and the ground voltage VSS. However, corresponding input and output signals of FIGS. 4D to 4F according to the present invention have a highest value which is less than the power supply voltage VDD, and a lowest value which is more than the ground voltage VSS. Therefore, a logic transition is carried out rapidly, and a higher operating speed is obtained accordingly.

Figures 5A, 5B:
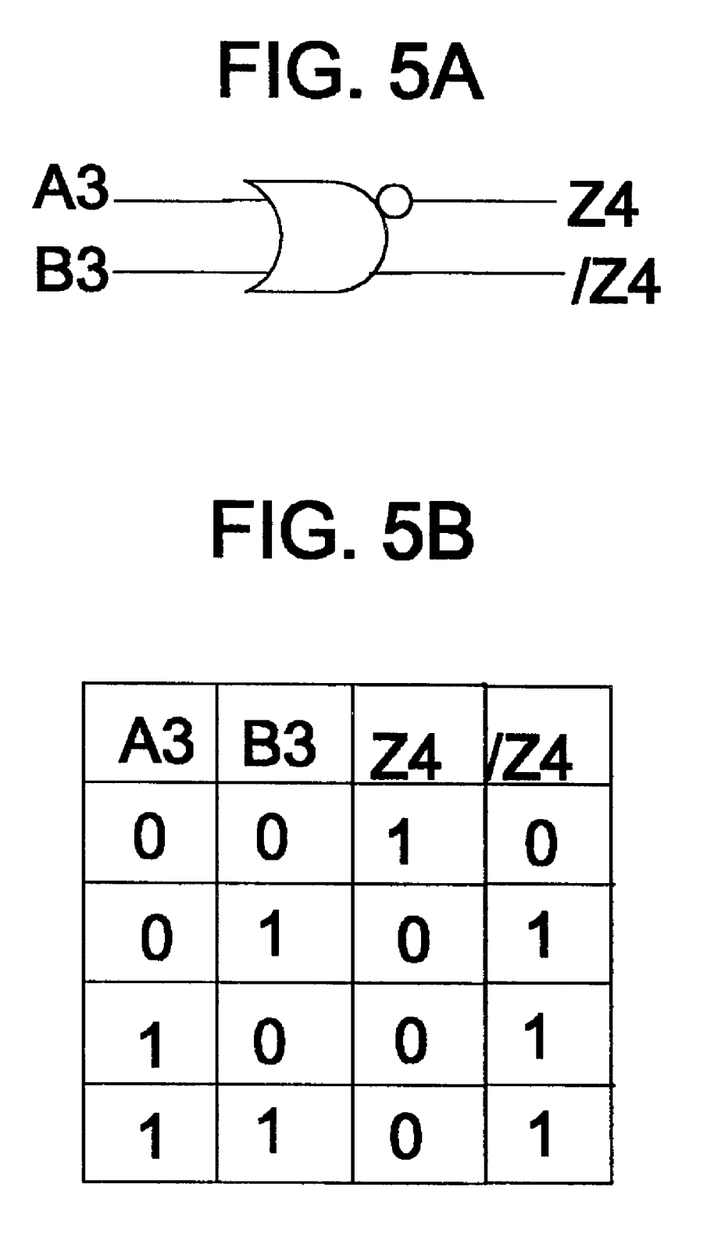
FIGS. 5A to 5C show differential mode NAND/NOR gates according to another embodiment of the present invention.
Figure 5C:
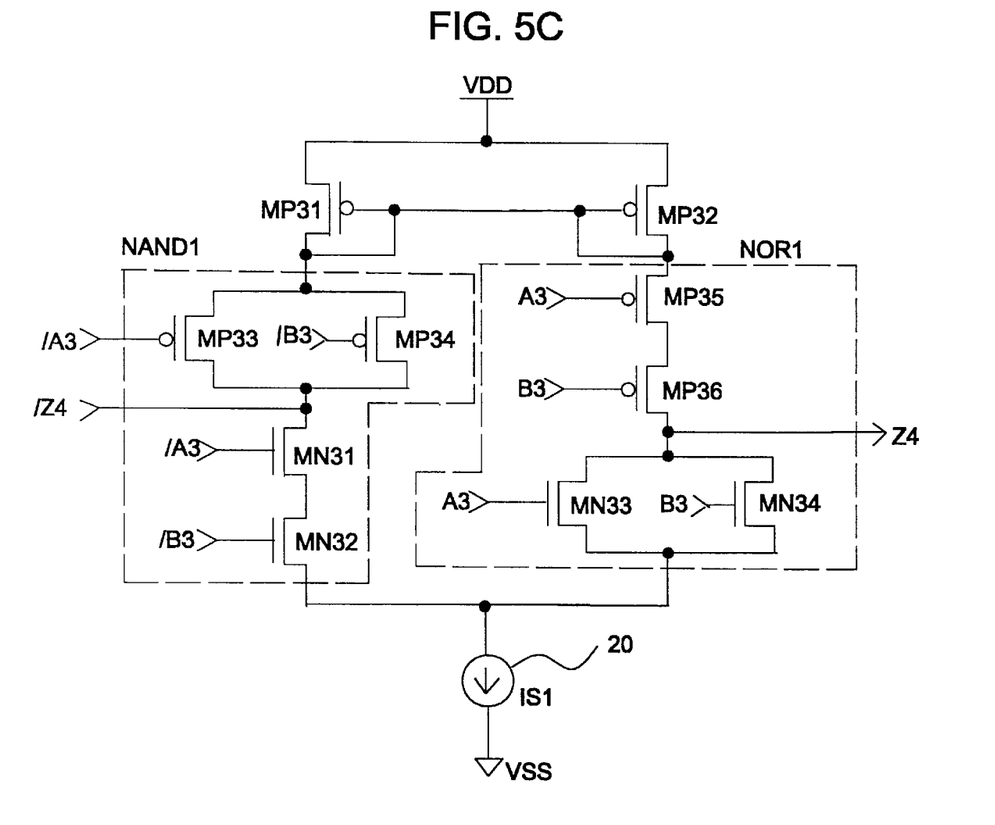

FIGS. 5A to 5C are a logic symbol, truth table and circuit, respectively, of another embodiment of differential mode NAND/NOR gates in accordance with the present invention.

In FIG. 5A, A3 and B3 are input signals, and Z4 and /Z4 are output signals, which are complementary. Output signal Z4 is a result of NOR operation on the two input signals A3, B3, and output signal /Z4 is a result of an OR operation.

That is, as shown in FIG. 5B, when at least one of the two input signals A3, B3 is 1, output signal Z4 becomes 0, while when both are 0, output signal Z4 becomes 1. Furthermore, when at least one of the two input signals A3, B3 is 1, output signal /Z4 becomes 1, while when both are 0, output signal /Z4 becomes 0.

As shown in FIG. 5C, the structure of the differential mode NAND/NOR gates in accordance with this embodiment of the present invention is the same as that shown in FIG. 3C, except that the input signals A3 and B3 and the inverted input signals /A3 and /B3 have been applied differently. Namely, input signals A3 and B3 have been applied to PMOS transistor MP35 and PMOS transistor MP36, respectively, and also applied to the NMOS transistors MN33 and MN34, respectively. The inverted input signals /A3 and /B3 have been applied to the PMOS transistor 33 and PMOS transistor 34, respectively, and also applied to the NMOS transistor MN31 and the NMOS transistor MN32, respectively. Because the structure is the same, except for the differently applied input signals, the operation thereof will not be described in detail.

Figure 6:
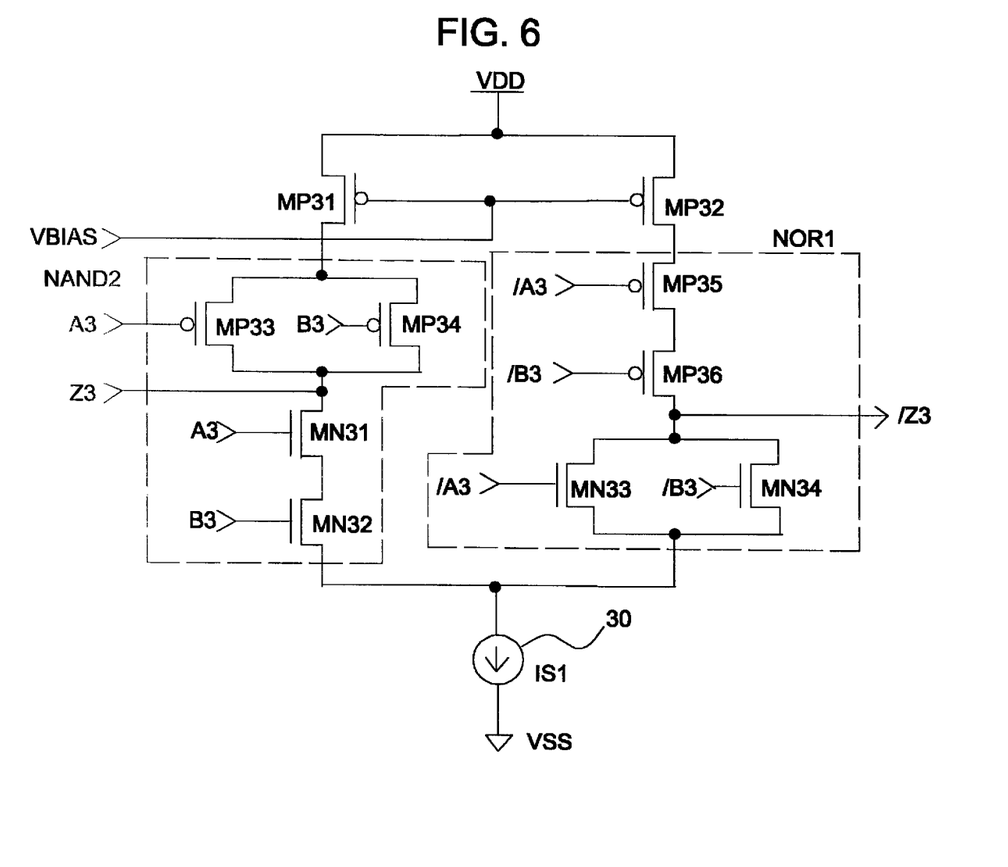
FIG. 6 shows another embodiment of the differential mode NAND/NOR gates according to the present invention.

FIG. 6 shows another embodiment of the differential mode NAND/NOR gates according to the present invention, which is identical with FIG. 3C except that the gates of the two PMOS transistors MP31, MP32 are supplied a bias voltage $V_{BIAS}$. Applying bias voltage $V_{BIAS}$ to transistors MP31, MP32 allows one to adjust the highest voltage level in the case that the output signals Z3, /Z3 are 1, by controlling the bias voltage $V_{BIAS}$. If bias voltage $V_{BIAS}$ is increased, the highest voltage level is increased accordingly, while if the bias voltage $V_{BIAS}$ is decreased, the highest voltage level is also decreased. This means that the swing width of output signals is variable.

In the differential mode NAND/NOR gates according to the present invention input and output signals swing within a narrow range, thereby a higher-speed operation can be obtained, as well as lower power consumption.

Secondly, a stable output signal is generated regardless of variations in power supply voltage, and therefore, the induced noise is considerably improved.

Thirdly, it is possible that all of the MOS transistors, which constitute the differential mode NAND/NOR gates according to the present invention, have the same current driving capability, thereby the manufacturing process for determining the same current driving capability can be simplified.

Finally, in making a programmable gate array using the differential mode NAND/NOR gates of the present invention, it is possible to obtain two different results from one gate, thereby the number of devices can be reduced. As a result, the chip size can be reduced.

It will be apparent to those skilled in the art that various modifications and variations can be made in a differential mode NAND/NOR gates of the present invention without departing from the spirit or scope of the invention. Thus, it is intended that the present invention cover the modifications and variations of this invention provided they come within the scope of the appended claims and their equivalents.

What is claimed is:

1. A logic circuit, comprising:
   a first load resistance having a first current driving capability connected to a power supply voltage;
   a constant current source having a second current driving capacity connected to ground; and
   a first logic gate connected between said first load resistance and said constant current source, said first logic gate performing a first logic operation on received inputs to generate a first output,
   wherein said first load resistance includes a transistor connected between said power supply voltage and said first logic gate, and having a connected gate and drain.

2. The logic circuit of claim 1, wherein said first and second current driving capabilities are substantially equal.

3. The logic circuit of claim 1, wherein said first logic gate performs one of a NAND, NOR and an OR logic operation.

4. The logic circuit of claim 1, wherein said first current driving capability is controllable.

5. The logic circuit of claim 1, wherein said transistor is a PMOS transistor.

6. The logic circuit of claim 1, wherein said first load resistance includes a PMOS transistor having a source connected to said power supply voltage, a drain connected to said first logic gate, and a gate connected to a bias voltage.

7. The logic circuit of claim 1, further comprising:
   a second load resistance having a third current driving capability connected to said power supply voltage; and
   a second logic gate connected between said second load resistance and said constant current source, said second logic gate performing a second logic operation on said received inputs to generate a second output.

8. The logic circuit of claim 7, wherein said first, second and third current driving capabilities are substantially equal.

9. The logic circuit of claim 7, wherein said first logic operation is an OR operation and said second logic operation is a NOR operation.

10. The logic circuit of claim 8, wherein said first and second logic gates include a first and second plurality of MOS transistors, respectively, said first and second plurality of MOS transistors having current driving capabilities which are substantially equal t6 said first, second and third current driving capabilities.

11. A logic circuit, comprising:
    a first load resistance having a first current driving capability connected to a power supply voltage;

a constant current source having a second current driving capacity connected to ground;

a first logic gate connected between said first load resistance and said constant current source, said first logic gate performing a first logic operation on received inputs to generate a first output;

a second load resistance having a third current driving capability connected to said power supply voltage; and a second logic gate connected between said second load resistance and said constant current source, said second logic gate performing a second logic operation on said received inputs to generate a second output, wherein said first logic operation is a NAND operation and said second logic operation is a NOR operation.

12. A logic circuit, comprising:

a first load resistance having a first current driving capability connected to a power supply voltage;

a constant current source having a second current driving capacity connected to ground;

a first logic gate connected between said first load resistance and said constant current source, said first logic gate performing a first logic operation on received inputs to generate a first output;

a second load resistance having a third current driving capability connected to said power supply voltage; and a second logic gate connected between said second load resistance and said constant current source, said second logic gate performing a second logic operation on said received inputs to generate a second output, wherein said first logic gate includes a first pull-up circuit performing a first pull-up operation on said first output based on said received inputs and a first pull-down circuit performing a first pull-down operation on said first output based on said received inputs; and said second logic gate includes a second pull-up circuit performing a second pull-up operation on said second output based on said received inputs and a second pull-down circuit performing a second pull-down operation on said second output based on said received inputs.

* * * * *